(12) United States Patent
Takei

(10) Patent No.: US 7,659,011 B2
(45) Date of Patent: Feb. 9, 2010

(54) ORGANIC ELECTROLUMINESCENT DEVICE, METHOD FOR MANUFACTURING THE SAME, AND ELECTRONIC APPLIANCE

(75) Inventor: Shuichi Takei, Shimosuwa-machi (JP)

(73) Assignee: Seiko Epson Corporation (JP)

( * ) Notice: Subject to any disclaimer, the term of this patent is extended or adjusted under 35 U.S.C. 154(b) by 383 days.

(21) Appl. No.: 10/914,042

(22) Filed: Aug. 6, 2004

(65) Prior Publication Data

US 2005/0064239 A1    Mar. 24, 2005

(30) Foreign Application Priority Data

| Aug. 8, 2003 | (JP) | ............................. 2003-290644 |
| Aug. 8, 2003 | (JP) | ............................. 2003-290645 |
| Jun. 21, 2004 | (JP) | ............................. 2004-182526 |

(51) Int. Cl.
  *H01L 29/20* (2006.01)
  *H01J 1/62* (2006.01)
  *B05D 5/12* (2006.01)

(52) U.S. Cl. ...................... 428/690; 428/917; 313/504; 313/506; 257/89; 427/66

(58) Field of Classification Search ................ 428/690, 428/917; 257/40, 102, 103; 313/504, 506
  See application file for complete search history.

(56) References Cited

U.S. PATENT DOCUMENTS

| 5,962,962 A | * | 10/1999 | Fujita et al. | ................. 313/412 |
| 6,468,676 B1 | * | 10/2002 | Ueda et al. | ................. 428/690 |
| 6,524,727 B1 | * | 2/2003 | Kathirgamanathan | ....... 428/690 |
| 6,558,817 B1 | * | 5/2003 | Ueda et al. | ................. 428/690 |

FOREIGN PATENT DOCUMENTS

| JP | 2000-243569 | 9/2000 |
| JP | 2002-184583 | 6/2002 |
| JP | 2003-100455 | 4/2003 |

OTHER PUBLICATIONS

Communication from Japanese Patent Office regarding related application.

* cited by examiner

*Primary Examiner*—D. Lawrence Tarazano
*Assistant Examiner*—Camie S Thompson
(74) *Attorney, Agent, or Firm*—Harness, Dickey & Pierce, P.L.C.

(57) ABSTRACT

An organic EL device includes a cathode, organic luminescent layers, and an electron-injection layer disposed between the cathode and the luminescent layers. The electron-injection layer contains an organic metal complex having a central atom of the same metal element as a constituent element of the cathode. A larger number of ligands than the valence of the central atom of the complex are coordinated to the central atom.

4 Claims, 10 Drawing Sheets

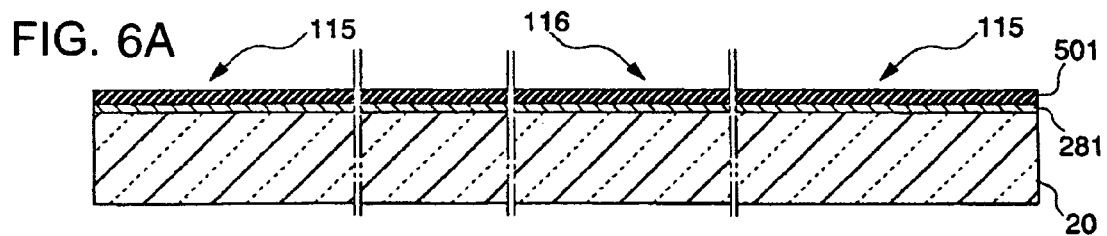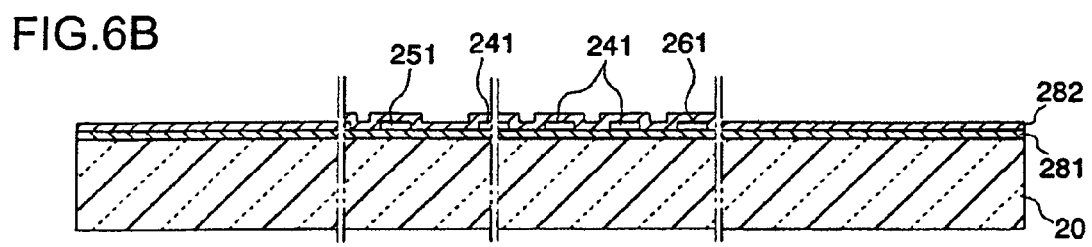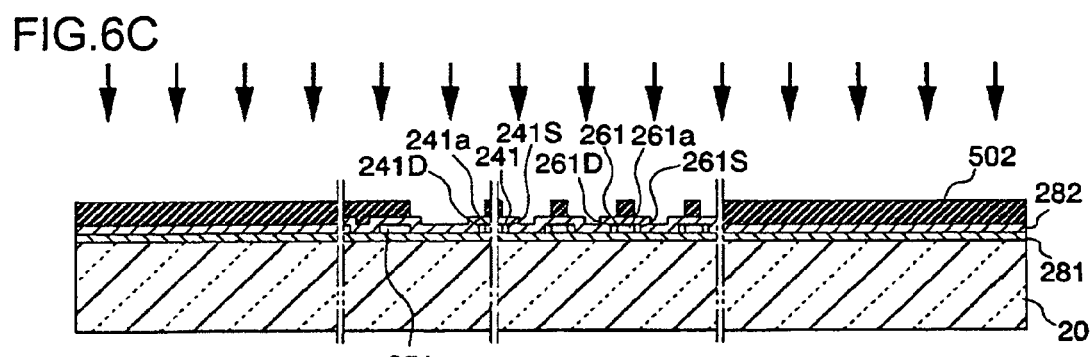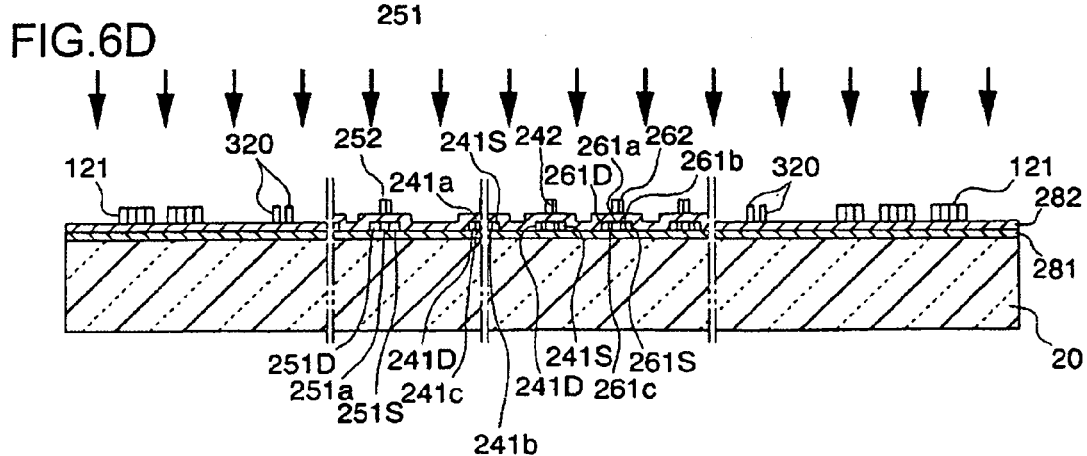

ORGANIC ELECTROLUMINESCENT DEVICE, METHOD FOR MANUFACTURING THE SAME, AND ELECTRONIC APPLIANCE

RELATED APPLICATIONS

This application claims priority to Japanese Patent Application Nos. 2003-290644 filed Aug. 8, 2003; 2003-290645 filed Aug. 8, 2003, and 2004-182526 filed Jun. 21, 2004 which are hereby expressly incorporated by reference herein in their entirety.

BACKGROUND

The present invention relates to an organic electroluminescent device, a method for manufacturing the device, and an electronic appliance including the device.

An electron-injection layer plays an important role in organic electroluminescent devices (hereinafter referred to as organic EL devices). The luminescent characteristics of organic EL devices greatly depend on the structure of the electron-injection layer. Conventionally, the electron-injection layer is composed of an inorganic material such as lithium fluoride (LiF) and calcium (Ca). Although LiF and Ca are originally insulators, a thin film of LiF or Ca provides an electron-injection effect.

The above materials, however, cannot provide excellent characteristics for all of red (R), green (G), and blue (B) luminescent layers. For example, LiF can provide an excellent electron-injection effect only for B luminescent layers.

To solve the problem, for example, Japanese Unexamined Patent Application Publication No. 2000-243569 proposes an organic EL device including an electron-injection layer composed of an organic metal complex. This complex has a central atom of an alkali metal and a chelating ligand coordinated to the central atom. If such a complex is disposed between an organic luminescent layer and an inorganic cathode, the complex provides high adhesion at both interfaces to enhance the luminescent characteristics of all of R, G, and B luminescent layers. In addition, for example, the above structure can be applied to top-emission organic EL devices to enable a brighter display because a transparent cathode including a metal complex can be readily formed.

The above device, however, cannot provide sufficient luminescent efficiency, and therefore still higher luminescent efficiency is expected. In this device, additionally, the central atom of the complex may be separated from the ligand to diffuse into the luminescent layer as an impurity during the formation of the cathode, thus failing to provide stable characteristics.

An object of the present invention, which aims at solving the above problems, is to provide an organic EL device that can provide an excellent electron-injection effect for all of R, G, and B luminescent layers and that has stable luminescent characteristics, a method for manufacturing the device, and an electronic appliance including the device.

SUMMARY

To achieve the above object, the present invention provides an organic EL device including an anode; a cathode; an organic luminescent layer disposed between the anode and the cathode; and an electron-injection layer disposed between the cathode and the organic luminescent layer. The organic luminescent layer is composed of, for example, a polymeric material. The electron-injection layer contains an organic metal complex having a central atom of the same metal element as at least one constituent element of the cathode. In the present invention, the term "electron-injection layer" also means "electron-transport layer," which has an electron-transport property, and "hole-blocking layer," which blocks holes to keep them in the luminescent layer.

According to the present invention, the organic metal complex is used for the electron-injection layer to enhance the adhesion of the electron-injection layer to the cathode, which is composed of a metal, and to the luminescent layer, which is composed of an organic material. This electron-injection layer can therefore improve the luminescent efficiency of each type of red (R), green (G), and blue (B) luminescent layers. According to the present invention, particularly, the above complex has a central atom of the same metal element as a constituent element of the cathode. Such a complex can further increase the adhesion between the electron-injection layer and the cathode, thus providing still higher electron-injection efficiency. Furthermore, the central atom of the complex is of the same metal element as at least one constituent element of the cathode. The complex can therefore reliably hold the cathode material to inhibit the diffusion of the cathode material into the luminescent layer, thus providing stable luminescent characteristics.

The central atom of the above complex only needs to be of the same metal element as a constituent element of the cathode in the vicinity of the interface to the electron-injection layer (that is, a constituent element of the cathode adjacent to the electron-injection layer). When, for example, the cathode is composed of a laminate of thin films, the central atom of the complex only needs to be of the same element as a constituent element of the thin film adjacent to the electron-injection layer.

The cathode preferably contains a metal element having a low work function (for example, an alkali metal, an alkaline earth metal, magnesium, or a rare earth metal) to enhance electron-injection efficiency. This metal element only needs to exist at the interface to the electron-injection layer. If, for example, the cathode is composed of a laminate of thin films, at least the thin film adjacent to the luminescent layer is composed of the above metal element having a low work function. If the central atom of the complex is of the same metal element having a low work function (for example, an alkali metal, an alkaline earth metal, magnesium, or a rare earth metal), the complex can improve the adhesion between the cathode and the electron-injection layer and reduce the injection barrier for electrons, further enhancing the luminescent efficiency. To achieve the above object, preferably, the organic metal complex in the organic EL device of the present invention has a larger number of ligands than the valence of the central atom.

The known organic metal complex described above has a central atom to which chelating ligands are coordinated. The number of the ligands corresponds to the valence of the central atom. If the central atom is of an element having a smaller valence number (for example, an alkali metal), fewer ligands surround the central atom (for example, the above known complex has one ligand). Consequently, as described above, the central atom may be separated from the ligands, depending on the deposition conditions of the cathode. In general, the coordination number of the central atom is larger than the valence of the central atom. If ligands other than the chelating ligands (for example, neutral ligands such as heterocyclic amines) are coordinated to the central atom as in the present invention, the central atom can have a larger number of ligands than the valence of the central atom. The coordination bond of ligands other than the chelating ligands to the central atom can increase the chemical stability of the complex. In addition, these ligands surround the central atom to act as steric hindrance, thereby stably holding the central atom. The present invention can therefore increase the stability of the complex to inhibit the intrusion of impurities into the luminescent layer, thus providing an organic EL device having high luminescent efficiency and stable characteristics. Furthermore, higher complex stability leads to higher moisture resistance.

In the present invention, additionally, plural types of organic luminescent layer segments having different luminescent colors (for example, R, G, and B luminescent layer segments) may be arrayed on a substrate to provide a full-color display. The different types of luminescent layer segments, however, may have different optimum complexes. In this case, preferably, the organic metal complex is selected for each type of organic luminescent layer segments, and the electron-injection layer contains the organic metal complexes. The electron-injection layer, containing all of the optimum organic metal complexes for the individual types of luminescent layer segments, can have an excellent electron-injection effect on all types of luminescent elements. In addition, color balance can be adjusted by changing the mixing ratio of the complexes.

Alternatively, preferably, the electron-injection layer is composed of plural types of electron-injection layer segments corresponding to the individual types of organic luminescent layer segments; and each type of electron-injection layer segments contains the organic metal complex selected for the corresponding type of organic luminescent layer segments. In this case, the organic metal complex for the electron-injection layer can be selected for each type of organic luminescent layer segments, thus enhancing the electron-injection property for each type of organic luminescent layer segments and facilitating the adjustment of, for example, the color balance of each type of luminescent layer segments.

Various complexes including chelate complexes and crown ether complexes, which are cyclic polyethers, may be used as the above organic metal complex. Among them, a β-diketone ligand can form a stable metal complex (β-diketone complex) because the ligand acts as an acidic reagent and is a multidentate ligand having oxygen atoms.

The present invention further provides a method for manufacturing an organic EL device. This method includes the steps of forming an organic luminescent layer; forming an electron-injection layer; and forming a cathode. The step of forming an electron-injection layer includes a substep of depositing a first organic metal complex having the same number of chelating ligands as the valence of an central atom thereof with an organic material for a neutral ligand to form a second organic metal complex having a larger number of ligands than the valence of the central atom thereof.

This method can provide an organic EL device having high efficiency and stable luminescent characteristics as described above. According to this method, additionally, the formation of the complex by co-deposition enables cathode design (including the electron-injection layer) suited to the luminescent material used because known complex and ligand materials can be freely combined in a deposition machine. Furthermore, an organic metal complex having any composition can be provided by changing deposition conditions, so that the element structure can be readily optimized.

At the step of forming an organic luminescent layer, plural types of organic luminescent layer segments having different luminescent colors (for example, R, G, and B luminescent layer segments) may be arrayed on a substrate to provide a full-color display. The different types of luminescent layer segments, however, may have different optimum complexes. In this case, preferably, at the step of forming an electron-injection layer, the first organic metal complex is selected for each type of organic luminescent layer segments, and the first organic metal complexes are deposited with the organic material for a neutral ligand. The electron-injection layer, containing all of the optimum organic metal complexes for the individual types of luminescent layer segments, can have an excellent electron-injection effect on all types of luminescent elements. In addition, the color balance can be adjusted by changing the mixing ratio of the complexes.

The present invention provides another method for manufacturing an organic EL device. This method includes the steps of forming an organic luminescent layer; forming an electron-injection layer; and forming a cathode. The step of forming an electron-injection layer includes the substeps of forming a first organic metal complex film by applying a coating solution containing a first organic metal complex having the same number of chelating ligands as the valence of an central atom thereof; and forming a film of a second organic metal complex having a larger number of ligands than the valence of the central atom thereof on the organic luminescent layer by depositing an organic material for a neutral ligand on the first organic metal complex film. This method is the same as the previous manufacturing method except that a wet process (namely, coating) is employed; therefore, this method can provide the same effect as the previous method.

Also, in this method, at the step of forming an organic luminescent layer, plural types of organic luminescent layer segments having different luminescent colors (for example, R, G, and B luminescent layer segments) may be arrayed on a substrate to produce an organic EL device that can provide a full-color display. In this case, preferably, at the substep of forming a first organic metal complex film, the first organic metal complex is selected for each type of organic luminescent layer segments, and a coating solution prepared by mixing the first organic metal complexes in a solvent (that is, a coating solution containing the first organic metal complexes) is applied onto the organic luminescent layer segments by, for example, spin coating to form an optimum electron-injection layer for the individual types of luminescent layer segments. The electron-injection layer, containing all of the optimum organic metal complexes for the individual types of luminescent layer segments, can have an excellent electron-injection effect on all types of luminescent elements. In addition, the color balance can be adjusted by changing the mixing ratio of the complexes.

Alternatively, preferably, at the substep of forming a first organic metal complex film, the first organic metal complex is selected for each type of organic luminescent layer segments and is used to prepare a coating solution for each type of organic luminescent layer segments, and each of the coating solutions (that is, coating solutions containing the different first organic metal complexes) is applied onto the corresponding type of organic luminescent layer segments by droplet discharging. Using droplet discharging, in contrast to spin coating, each coating solution can be selectively applied onto the corresponding type of organic luminescent layer segments. This method therefore enables optimum material design for each type of organic luminescent layer segments. In addition, this method facilitates the adjustment of color balance for each type of organic luminescent layer segments.

In the above methods, preferably, the central atom of the organic metal complex is of the same metal element as at least one constituent element of the cathode. The electron-injection layer and the cathode, containing the same element, can adhere more strongly to each other, thus providing still higher electron-injection effect. Furthermore, this element, even if diffusing downward during the formation of the cathode, does not act as an impurity on the electron-injection layer, thus providing luminescent elements having stable electrical characteristics. The central atom of the above complex only needs to be of the same metal element as a constituent element of the cathode in the vicinity of the interface to the electron-injection layer. When, for example, the cathode is composed of a laminate of thin films, the central atom of the complex only needs to be of the same element as a constituent element of the thin film adjacent to the electron-injection layer.

The present invention further provides an electronic appliance including the above organic EL device. This electronic appliance has a long life and can provide a bright display.

BRIEF DESCRIPTION OF THE DRAWINGS

FIGS. 6A-D show sectional views illustrating steps of a method for manufacturing the organic EL device.

DETAILED DESCRIPTION

An organic EL device according to an embodiment of the present invention will now be described with reference to the drawings.

Organic EL Device

Figure 1:
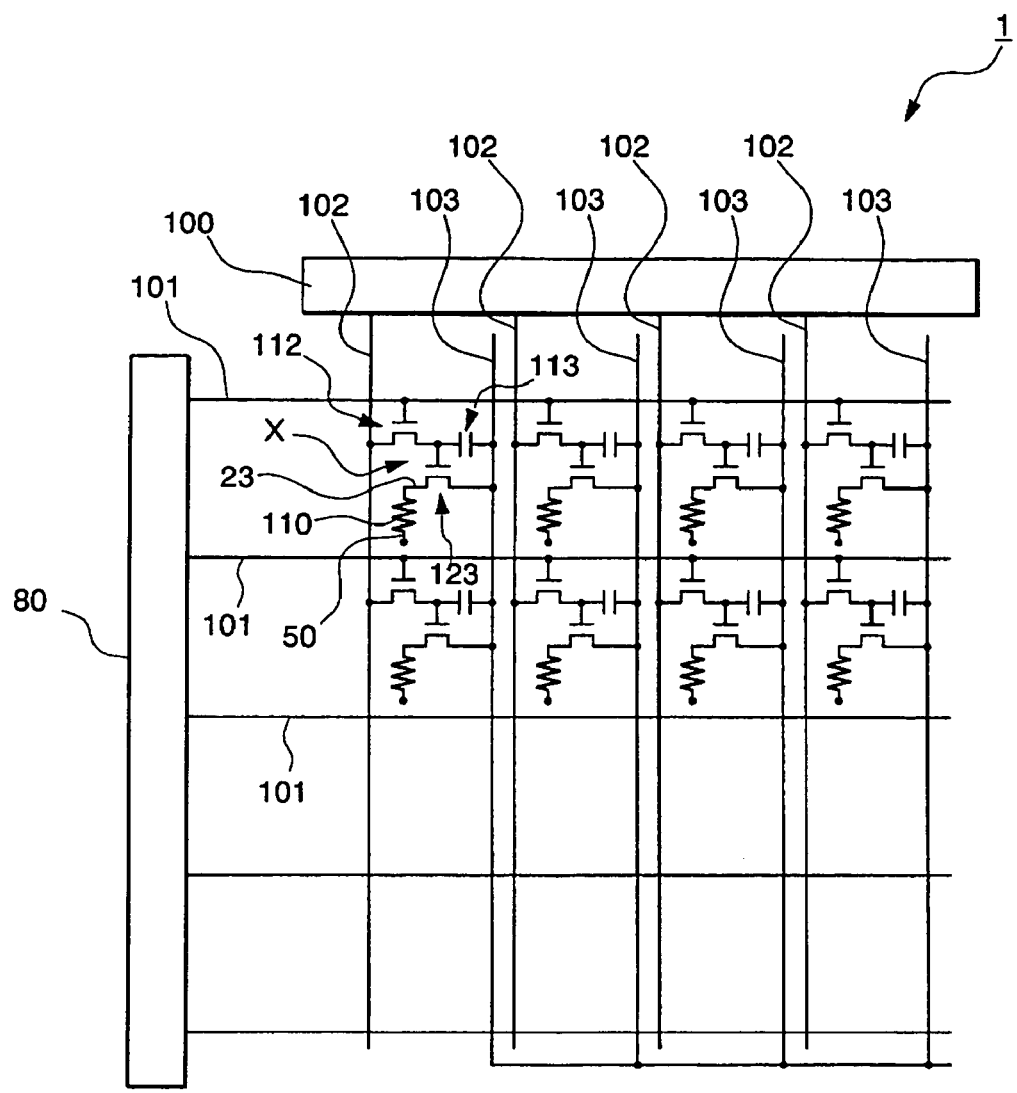
FIG. 1 is a schematic wiring diagram of an organic EL device according to an embodiment of the present invention.

FIG. 1 is a schematic wiring diagram of the organic EL device according to this embodiment.

In FIG. 1, an organic EL device 1 is an active-matrix display including thin-film transistors (hereinafter referred to as TFTs) as switching elements.

This organic EL device 1 includes scanning lines 101, signal lines 102 extending in a direction orthogonal to the scanning lines 101, and power lines 103 extending in parallel with the individual signal lines 102. A pixel area X is provided in the vicinity of each intersection point of the scanning lines 101 and the signal lines 102.

The signal lines 102 are connected to a data-line drive circuit 100 including a shift register, a level shifter, a video line, and an analog switch. On the other hand, the scanning lines 101 are connected to a scanning-line drive circuit 80 including a shift register and a level shifter.

Each pixel area X includes a switching TFT 112 having a gate electrode that is supplied with a scanning signal via the scanning lines 101; a hold capacitor 113 for holding a pixel signal supplied from the signal lines 102 via the switching TFT 112; a drive TFT 123 having a gate electrode that is supplied with the pixel signal held by the hold capacitor 113; a pixel electrode (anode) 23 into which drive current flows from the power lines 103 when the pixel electrode 23 is electrically connected to the power lines 103 via the drive TFT 123; and a functional layer 110 held between the pixel electrode 23 and a cathode 50. The pixel electrode 23, the cathode 50, and the functional layer 110 constitute a luminescent element (organic EL element).

In this organic EL device 1, when the scanning lines 101 are driven to turn on the switching TFT 112, the potential of the signal lines 102 at the time is held by the hold capacitor 113. The state of the hold capacitor 113 determines whether the drive TFT 123 is on/off. Current flows from the power lines 103 into the cathode 50 via the channel of the drive TFT 123, the pixel electrode 23, and the functional layer 110. The functional layer 110 then emits light according to the amount of current flowing through it.

The organic EL device 1 in this embodiment will now be described in detail with reference to FIGS. 2 to 5.

First, the planar structure of the organic EL device 1 is described with reference to FIG. 2.

The organic EL device 1 includes an electrically insulating substrate 20; a pixel electrode region (not shown in the drawing) in which the pixel electrodes connected to the switching TFTs (not shown in the drawing) are arranged in a matrix on the substrate 20; a power line (not shown in the drawing) disposed around the pixel electrode region and connected to the individual pixel electrodes 23; and a pixel part 3 (outlined by the one-dot chain line in FIG. 2) that is substantially rectangular in plan view and is positioned at least above the pixel electrode region. In the present invention, the substrate 20 and components formed thereon, including the switching TFTs, various circuits, and interlayer insulating films, as will be described later, are collectively referred to as a base part.

Figure 2:
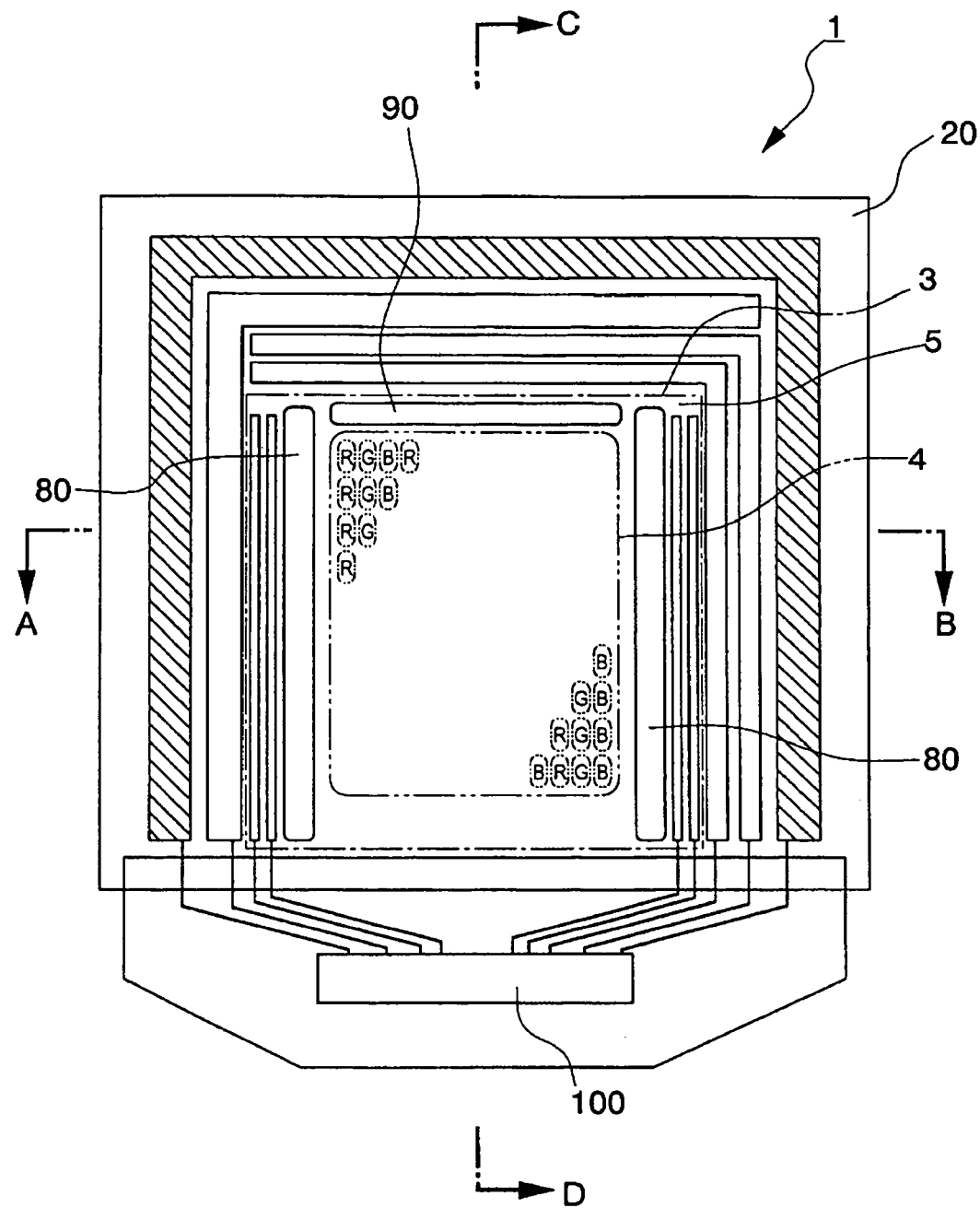
FIG. 2 is a schematic plan view of the organic EL device.

The pixel part 3 is divided into a central effective display region 4 (outlined by the two-dot chain line in FIG. 2) and a dummy region 5 (the region between the one-dot chain line and the two-dot chain line in FIG. 2) disposed around the effective display region 4.

In the effective display region 4, display areas R, G, and B each of which includes the pixel electrode 23 are arranged in a matrix at intervals in the A-B and C-D directions.

The scanning-line drive circuit 80 is disposed on each of the left and right sides of the effective display region 4 in FIG. 2. These scanning-line drive circuits 80 are disposed below the dummy region 5.

A check circuit 90 is disposed on the top side of the effective display region 4 in FIG. 2. This check circuit 90 checks the operational state of the organic EL device 1. For example, the check circuit 90 includes a check information output device (not shown in the drawing) for externally outputting check results to check the quality of displays and inspect them for defects during manufacture and before shipment. The check circuit 90 is disposed below the dummy region 5.

Figure 3:
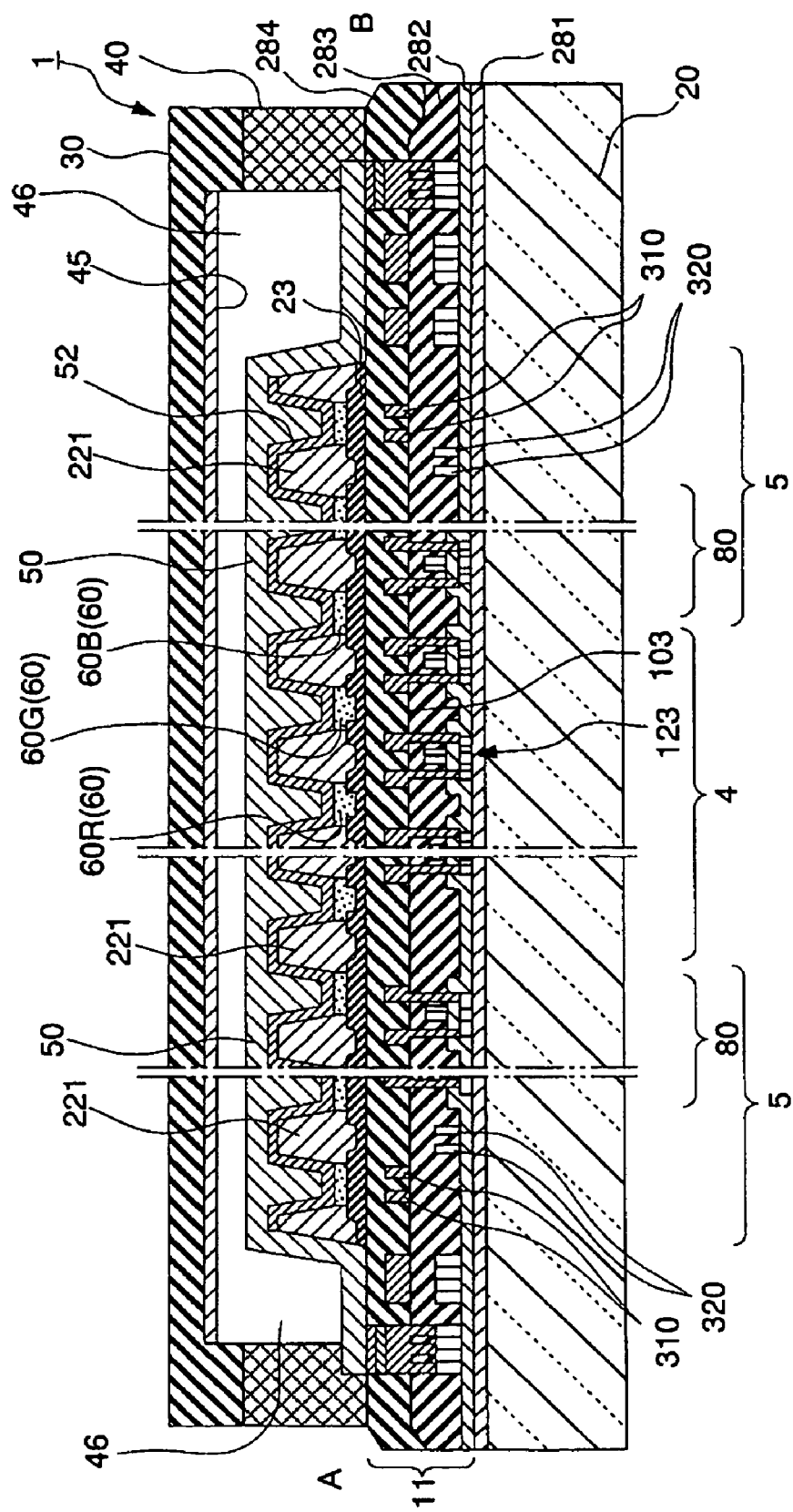
FIG. 3 is a sectional view taken along line A-B in FIG. 2.
Figure 4:
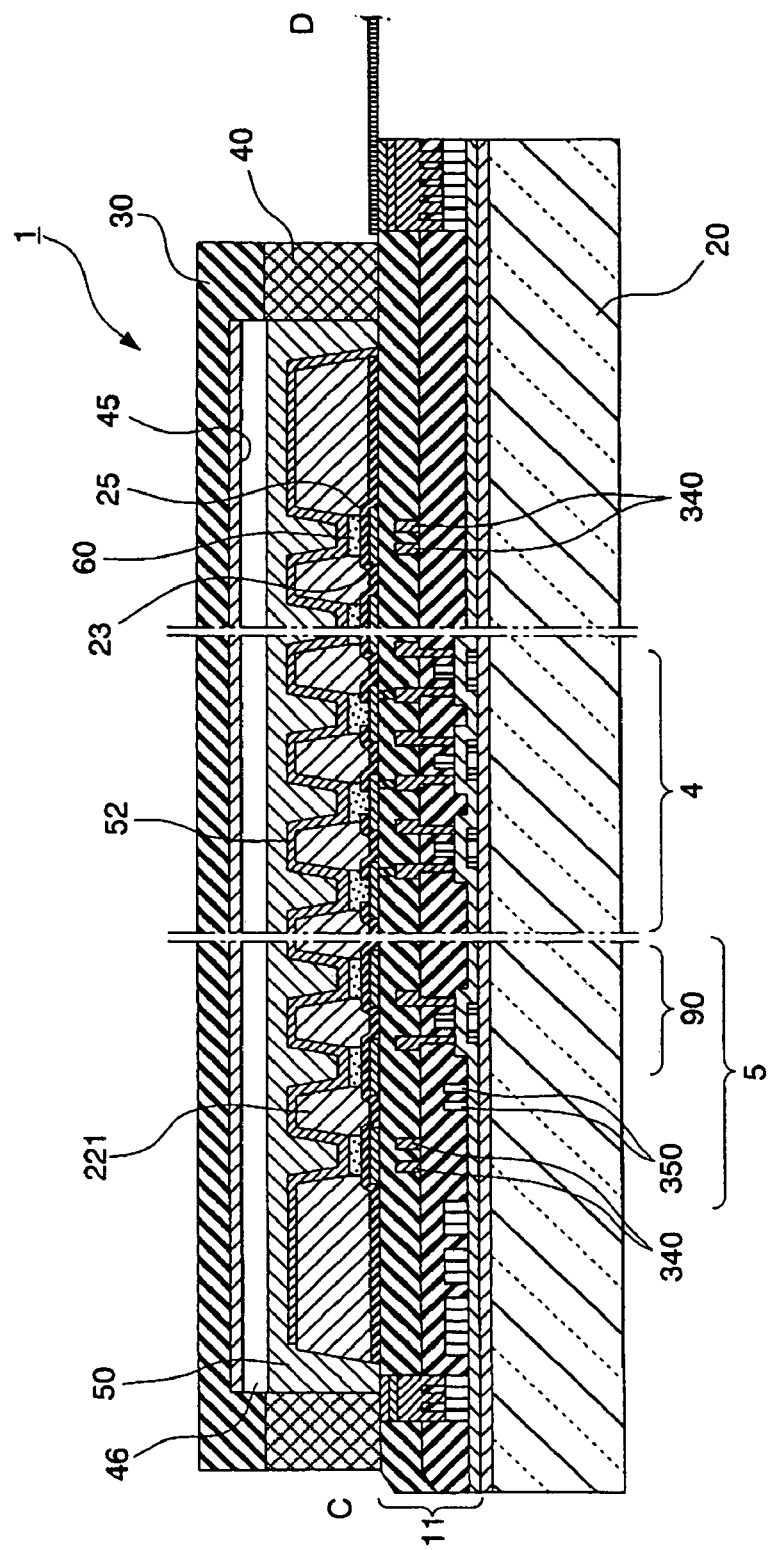
FIG. 4 is a sectional view taken along line C-D in FIG. 2.

A drive voltage is applied from a predetermined power source to the scanning-line drive circuits 80 and the check circuit 90 via drive voltage conducting parts 310 (see FIG. 3) and 340 (see FIG. 4). In addition, a drive control signal is transmitted and a drive voltage is applied from, for example, a predetermined main driver for controlling the operation of the organic EL device 1 to the scanning-line drive circuits 80 and the check circuit 90 via drive control signal conducting parts 320 (see FIG. 3) and a drive voltage conducting part 350 (see FIG. 4). The drive control signal is a command signal transmitted by, for example, the main driver to control the signal output of the scanning-line drive circuits 80 and the check circuit 90.

Figure 5:
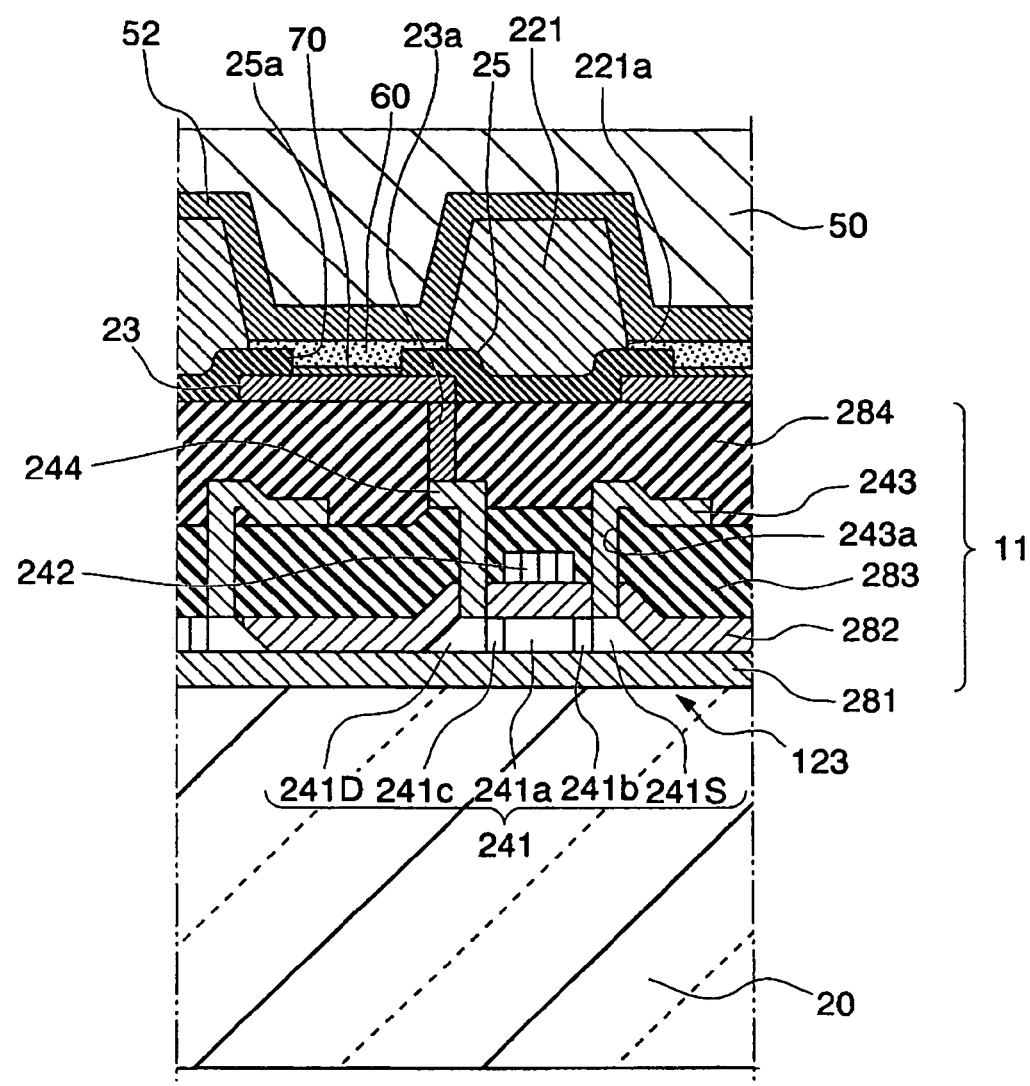
FIG. 5 is an enlarged sectional view of an essential part in FIG. 3.

The sectional structure of the organic EL device 1 is then described with reference to FIGS. 3 to 5. FIG. 3 is a sectional view taken along line A-B in FIG. 2. FIG. 4 is a sectional view taken along line C-D in FIG. 2. FIG. 5 is an enlarged view of an essential part in FIG. 3.

In FIGS. 3 and 4, the organic EL device 1 is sealed by attaching a sealing substrate 30 to the substrate 20 with a sealing resin 40.

If the organic EL device 1 has a bottom-emission structure, the substrate 20 is composed of a transparent or translucent material so that the organic EL device 1 can emit light through the substrate 20. Examples of the material used include glass, quartz, and resins (plastic materials and films). In particular, an inexpensive soda glass substrate is preferably used as the substrate 20.

If, on the other hand, the organic EL device 1 has a top-emission structure, the substrate 20 may be composed of either a transparent or nontransparent material because the organic EL device 1 emits light through the sealing substrate 30, that is, the opposite side of the substrate 20. Examples of the nontransparent material used include ceramics such as alumina, sheets that are composed of a metal such as stainless steel and are subjected to an insulation process such as surface oxidation, thermosetting resins, and thermoplastic resins.

The sealing substrate 30 may be composed of, for example, an electrically insulating board. For the top-emission structure, the sealing substrate 30 is composed of a transparent material such as glass, quartz, and a resin. The sealing resin 40 is composed of, for example, a thermosetting resin or an ultraviolet curable resin, preferably an epoxy resin, which is a thermosetting resin.

A circuit part 11 including various components such as the drive TFTs 123 for driving the pixel electrodes 23 is formed on the substrate 20, and the luminescent elements are provided on the circuit part 11. As shown in FIG. 5, these luminescent elements are formed by stacking the pixel electrodes 23, the functional layers 110, and the cathode 50 in that order. The functional layers 110 mainly include a luminescent layer 60.

The pixel electrodes 23 serve as anodes for supplying holes to the luminescent layers 60. For the bottom-emission structure, for example, the pixel electrodes 23 are composed of a transparent conductive material such as indium tin oxide (ITO) and an amorphous transparent conductive film based on indium oxide and zinc oxide (indium zinc oxide (IZO®); manufactured by Idemitsu Kosan Co., Ltd.). For the top-emission structure, on the other hand, the material for the pixel electrodes 23 is not limited to such a transparent conductive material, and may be, for example, a reflective or nontransparent conductive material such as aluminum (Al) and silver (Ag).

The luminescent layer 60 may be composed of a known fluorescent or phosphorescent material. Preferred examples of the luminescent material used include polyfluorenes (PF), poly(p-phenylene vinylene)s (PPV), polyphenylenes (PP), poly(p-phenylene)s (PPP), polyvinylcarbazole (PVK), polythiophenes, poly(dialkylfluorene) (PDAF), poly(fluorene-benzothiadiazole) (PFBT), poly(alkylthiophene) (PAT), and polysilanes such as poly(methylphenylsilane) (PMPS).

The polymeric material to be used may be doped with another polymeric material such as a perylene dye, a coumarin dye, and a rhodamine dye; or a low-molecular-weight material such as rubrene, perylene, 9,10-diphenylanthracene, tetraphenylbutadiene, Nile red, coumarin 6, and quinacridone.

The term "polymer" herein refers to polymers having a higher molecular weight than "low-molecular-weight materials," which have a molecular weight on the order of a few hundred. The above polymeric materials include not only macromolecules, which have a molecular weight not less than 10,000, but also oligomers, which have a molecular weight not more than 10,000.

In this embodiment, a set of the luminescent layers 60, which correspond to red (R), green (G), and blue (B), are arrayed in each pixel to provide a full-color display.

In this embodiment, hole-injection/transport layers 70 (see FIG. 5) may be optionally provided between the pixel electrodes 23 and the luminescent layers 60. These hole-injection/transport layers 70 block electrons traveling through the luminescent layers 60 efficiently, thus increasing the possibility of recombination between electrons and holes in the luminescent layers 60. The hole-injection/transport layers 70 are preferably composed of a material having a low injection barrier for holes from the pixel electrodes 23 to provide high hole mobility. Examples of such a material include polythiophenes and polypyrroles, which may be doped. A specific example of the material used is a dispersion of poly(3,4-ethylenedioxythiophene)/poly(styrene sulfonate) (PEDOT/PSS). This dispersion is prepared by dispersing poly(3,4-ethylenedioxythiophene) in poly(styrene sulfonate), as a dispersion medium, and further dispersing it in water.

In FIGS. 3 to 5, the cathode 50 has a larger area than the total area of the effective display region 4 and the dummy region 5, and covers the effective display region 4 and the dummy region 5. For the top-emission structure, for example, the cathode 50 is composed of a transparent conductive material. A preferred example of such a material is a co-deposited film of bathocuproine (BCP) and cesium (Cs). More preferably, ITO is deposited on the co-deposited film of BCP and Cs to increase the conductivity. Alternatively, an ultrathin Ca film (having a thickness of, for example, about 5 nm) may be formed instead of the co-deposited film of BCP and Cs, and ITO may be deposited on the ultrathin Ca film. For the bottom-emission structure, on the other hand, the material for the cathode 50 is not limited to such a transparent conductive material, and may be a reflective or nontransparent conductive material such as Al.

The cathode 50 preferably contains a metal element having a low work function (for example, an alkali metal, an alkaline earth metal, magnesium, or a rare earth metal other than promethium) to enhance electron-injection efficiency. This metal element only needs to exist at the interface of the cathode 50 on the side of the luminescent layers 60. If, for example, the cathode 50 is composed of a laminate of thin films, at least the thin film adjacent to the luminescent layers 60 is composed of the above metal element having a low work function. Specifically, a cathode having high electron-injection efficiency can be provided by forming a Ca film having a thickness of about 20 nm and then forming an Al film having a thickness of about 200 nm on the Ca film. The Al film also functions as a reflective layer for reflecting light to the substrate 20.

In this embodiment, an electron-injection layer 52 containing an organic metal complex is provided between the cathode 50 and the luminescent layers 60 to enhance the efficiency of the electron injection from the cathode 50 into the luminescent layers 60. This complex is an organic metal compound represented by the general formula $MA_nB_m$, where M is a central atom of a metal element; A is an organic chelating ligand; B is an organic neutral ligand; n is the valence of the central atom M; and m is zero or a natural number. Various complexes including chelate complexes and crown ether complexes may be used as the complex for use in this embodiment.

Preferred examples of the chelating ligand A include β-diketone ligands such as acetylacetone (acac), dipivaloylmethane (dpm), hexafluoroacetylacetone (hfa), 2,2,6,6-tetramethyl-3,5-octanedione (TMOD), thenoyltrifluoroacetone (TTA), and 1-phenyl-3-isoheptyl-1,3-propanedione (trade names: LIX 54 and LIX 51; Henkel Corp.); quinolinol ligands such as 8-quinolinol (oxine) and 2-methyl-8-quinolinol; phosphate ligands such as trioctylphosphine oxide (TOPO), tributyl phosphate (TBP), isobutyl methyl ketone (MBK), and bis(2-ethylhexyl) phosphate (D2EHPA); carboxylate ligands such as acetic acid and benzoic acid; and diphenylthiocarbazone. Among them, a β-diketone ligand can form a stable complex (β-diketone complex) because the ligand acts as an acidic reagent and is a multidentate ligand having oxygen atoms.

On the other hand, preferred examples of the above neutral ligand B include pyridine (py) and heterocyclic amines such as 2,2'-bipyridine (bpy), 1,10-phenanthroline (phen), 2,9-dimethyl-1,10-phenanthroline (dmp), bathophenanthroline (b-phen), and bathocuproine (bcp).

In this electron-injection layer 52, the central atom M may be of the same metal element as a constituent element of the cathode 50 to improve the adhesion between the electron-injection layer 52 and the cathode 50. In this case, the central atom M only needs to be of the same metal element as a constituent element of the cathode 50 in the vicinity of the interface to the electron-injection layer 52. When, for example, the cathode 50 is composed of a laminate of thin films, the central atom M only needs to be of the same metal element as a constituent element of the thin film adjacent to the electron-injection layer 52. Specifically, if the cathode 50 is composed of an Al monolayer film, the complex used is, for example, Al(acac)$_2$.bpy, which has a central atom of the same metal element as a constituent element of the cathode 50. If, additionally, the cathode 50 is composed of a laminate of Ca and Al films, the complex used is, for example, Ca(acac)$_2$.bpy. The central atom M of this complex is Ca, which exists on the side of the electron-injection layer 52 in the cathode 50. If, furthermore, the cathode 50 is composed of a co-deposited film of BCP and Cs, the complex used is, for example, Cs(acac)$_2$.bpy. The complex used may contain no neutral ligand B, that is, may be an organic metal compound represented by the general formula MA$_n$, where M, A, and n are defined above.

According to this embodiment, not only the chelating ligand A but also another ligand, namely the neutral ligand B, are intentionally coordinated to the central atom M to increase the chemical stability of the complex. In addition, the chelating ligand A and the neutral ligand B surround the central atom M to act as steric hindrance, thereby stably holding the central atom M. This embodiment can therefore increase the stability of the complex to inhibit the intrusion of impurities into the luminescent layers 60, thus providing an organic EL device having high luminescent efficiency and stable characteristics.

If the cathode 50 is composed of a metal element having a low work function, the central atom M of the complex is of a metal element such as an alkali metal, an alkaline earth metal, magnesium, and a rare earth metal. Such a complex has a high electron affinity and a low injection barrier for electrons, further enhancing the luminescent efficiency.

In this embodiment, furthermore, complexes suited to the individual types of the luminescent layers 60 may be contained in the electron-injection layer 52. When, as in this embodiment, each pixel includes R, G, and B luminescent layers, the different types of luminescent layers may have different optimum complexes. For example, a complex having a central atom of strontium (Sr) exhibits a large electron-injection effect on R luminescent layers, but a small effect on B luminescent layers. On the other hand, for example, a complex having a central atom of Li exhibits a large effect on B luminescent layers, but an insufficient effect on R and G luminescent layers. If, therefore, organic metal complexes suited to the individual types of the luminescent layers 60 are contained in the electron-injection layer 52, these complexes can functionally complement each other to further enhance the luminescent efficiency.

Alternatively, optimum metal complexes selected for the individual types of the luminescent layers 60 may be selectively provided on the corresponding types of the luminescent layers 60. In other words, the electron-injection layer 52 may be separately provided on each luminescent layer 60 so that each electron-injection layer 52 can contain only the metal complex selected for the corresponding type of the luminescent layers 60. This design enables the use of an optimum material and easy adjustment of color balance for each type of the luminescent layers 60.

The above complex may be used alone or in combination with a known material having an electron-transport property. Examples of such a known electron-transport material include cyclopentadienes, oxadiazoles, bisstyrylbenzenes, p-phenylene compounds, phenanthrolines, and triazoles. The electron-injection layer 52 preferably has a thickness of 0.1 to 1 nm to ensure the conductivity.

The present invention is particularly preferably applied to organic EL devices including a polymer luminescent layer. An organic EL device including a polymer luminescent layer and a cathode or electron-injection layer composed of an inorganic material such as Ca has difficulty in the adhesion between the luminescent layer and the cathode. In particular, polymeric materials, which have a molecular weight of about 1,000 to 300,000, have a significantly different molecular structure from those of low-molecular-weight materials. Consequently, for example, the polymer luminescent layer and the inorganic cathode have significantly different thermal expansion coefficients, which may cause the deterioration of the luminescent element at a high temperature. An electron-injection layer composed of an organic metal complex can function as a buffer layer to adhere firmly to the cathode and the luminescent layer. In addition, the electrical properties of such an electron-injection layer are intermediate between those of the polymeric material for the luminescent layer and the inorganic material for the cathode. Thus this electron-injection layer also functions as an electrical buffer layer to promote the injection of electrons into the luminescent layer. Accordingly, it is preferred to deposit an organic luminescent layer composed of a polymeric material having a molecular weight of about 1,000 to 300,000, an electron-injection layer composed of an organic metal complex having a molecular weight of about 100, and an inorganic cathode in that order.

The structure of the circuit part 11 for driving the luminescent elements is described with reference to FIG. 5.

In FIG. 5, the circuit part 11 is provided below the luminescent elements. This circuit part 11 is formed on the substrate 20 to constitute the base part. An underlying protective layer 281 mainly composed of SiO$_2$ is formed on the substrate 20, and a silicon layer 241 is formed on the underlying protective layer 281. A gate insulating layer 282 mainly composed of SiO$_2$ or SiN is formed on the silicon layer 241.

The silicon layer 241 has a channel region 241a overlapping with a gate electrode 242 with the gate insulating layer 282 disposed therebetween. The gate electrode 242 is a part of the scanning lines 101, which are not shown in FIG. 5. A first interlayer insulating layer 283 mainly composed of SiO$_2$ is formed on the gate insulating layer 282, which covers the silicon layer 241 and on which the gate electrode 242 is formed.

The silicon layer 241 further has a lightly doped source region 241b and a heavily doped source region 241S on the source side of the channel region 241a, and has a lightly doped drain region 241c and a heavily doped drain region 241D on the drain side of the channel region 241a; that is, the silicon layer 241 has a lightly doped drain (LDD) structure. The heavily doped source region 241S is connected to a source electrode 243 via a contact hole 243a extending through the gate insulating layer 282 and the first interlayer insulating layer 283. The source electrode 243 is a part of the power lines 103 described above (extending from the source electrode 243 in the direction perpendicular to the paper in FIG. 5; see also FIG. 1). On the other hand, the heavily doped drain region 241D is connected to a drain electrode 244 composed of the same layer as the source electrode 243 via a contact hole 244a extending through the gate insulating layer 282 and the first interlayer insulating layer 283.

The top of the first interlayer insulating layer 283, on which the source electrode 243 and the drain electrode 244 are formed, is covered with a second interlayer insulating layer 284 mainly composed of, for example, an acrylic resin. This second interlayer insulating layer 284 may also be composed of another material, for example, a silicon compound such as SiN and $SiO_2$. If the second interlayer insulating layer 284 is composed of such a silicon compound having a high gas barrier property, particularly a compound of silicon and nitrogen, it can inhibit the infiltration of oxygen, water, and so on through the substrate 20 into the luminescent layers 60 to prolong the life of the luminescent elements even if the substrate 20 is composed of a moisture-permeable resin.

The pixel electrode 23, which is composed of ITO, is formed on the second interlayer insulating layer 284. The pixel electrode 23 is connected to the drain electrode 244 via a contact hole 23a provided in the second interlayer insulating layer 284. That is, the pixel electrode 23 is connected to the heavily doped drain region 241D of the silicon layer 241 via the drain electrode 244.

TFTs (drive circuit TFTs) included in the scanning-line drive circuits 80 and the check circuit 90 (for example, p-channel or n-channel TFTs in inverters included in the shift registers) have the same structure as the above drive TFTs 123, though the drive circuit TFTs are not connected to the pixel electrodes 23.

A bank composite of the pixel electrodes 23, a lyophilic control layer 25, and organic bank layers 221 is provided on the second interlayer insulating layer 284. The lyophilic control layer 25 is mainly composed of, for example, a lyophilic material such as $SiO_2$ while the organic bank layers 221 are composed of, for example, an acrylic or polyimide resin. The hole-injection/transport layers 70 and the luminescent layers 60, in that order, are deposited on the pixel electrodes 23 in openings 25a provided in the lyophilic control layer 25 and bank openings 221a defined by the organic bank layers 221. In this embodiment, the term "lyophilic" means that the control layer 25 is at least more lyophilic than the material for the organic bank layers 221, such as acrylic and polyimide resins.

The above-described layers up to the second interlayer insulating layer 284 on the substrate 20 constitute the circuit part 11.

Method for Manufacturing Organic EL Device

According to an embodiment of the present invention, an example of methods for manufacturing the organic EL device 1 will now be described with reference to FIGS. 6 to 9. The sectional views in FIGS. 6 to 9 correspond to the sectional view taken along line A-B in FIG. 2.

Referring to FIG. 6(a), the underlying protective layer 281 is formed on the substrate 20. An amorphous silicon layer 501 is formed on the underlying protective layer 281 by, for example, ICVD or plasma CVD, and crystal grains are then allowed to grow by laser annealing or rapid heating to form a polysilicon layer.

Referring to FIG. 6(b), this polysilicon layer is patterned by photolithography to form silicon layers 241, 251, and 261 isolated from each other. The silicon layers 241 are formed in the effective display region 4 as components of the drive TFTs 123, which are connected to the pixel electrodes 23. The silicon layers 251 and 261 are components of p-channel and n-channel TFTs (drive circuit TFTs), respectively, included in the scanning-line drive circuits 80.

The gate insulating layer 282, which is composed of a silicon oxide film having a thickness of about 30 to 200 nm, is formed on the entire surface of the silicon layers 241, 251, and 261 and the underlying protective layer 281 by, for example, plasma CVD or thermal oxidation. If the gate insulating layer 282 is formed by thermal oxidation, the silicon layers 241, 251, and 261 can be simultaneously crystallized into polysilicon layers.

If the silicon layers 241, 251, and 261 are subjected to channel doping, boron ions, for example, are implanted into them at a dosage of about $1 \times 10^{12}$ cm$^2$ at this time. As a result, the silicon layers 241, 251, and 261 become lightly doped p-type silicon layers having a doping concentration of about $1 \times 10^{17}$ cm$^3$ (determined after activation annealing).

An ion-implantation-selection mask is formed above parts of the silicon layers 241 and 261. Phosphorus ions are then implanted at a dosage of about $1 \times 10^{15}$ cm$^2$. As a result, the dopant is self-aligned to the mask to form the heavily doped source region 241S and the heavily doped drain region 241D in each silicon layer 241 and a heavily doped source region 261S and a heavily doped drain region 261D in each silicon layer 261, as shown in FIG. 6(c).

Referring to FIG. 6(c), a conductive layer 502 for forming gate electrodes is formed on the entire surface of the gate insulating layer 282. This conductive layer 502 is composed of a doped silicon film, a silicide film, or a metal film such as an aluminum film, a chromium film, and a tantalum film, and has a thickness of about 500 nm. The conductive layer 502 is patterned to form gate electrodes 252 that are components of p-channel drive circuit TFTs, the gate electrodes 242, which are components of pixel TFTs, and gate electrodes 262 that are components of n-channel drive circuit TFTs, as shown in FIG. 6(d). The drive control signal conducting parts 320 (350) and first cathode power wiring layers 121 are formed at the same time. The drive control signal conducting parts 320 (350) are provided in the dummy region 5.

Referring to FIG. 6(d), phosphorus ions are implanted into the silicon layers 241, 251, and 261 at a dosage of about $4 \times 10^{13}$ cm$^2$ using the gate electrodes 242, 252, and 262 as masks. As a result, the dopant is self-aligned to the gate electrodes 242, 252, and 262 to form the lightly doped source region 241b and the lightly doped drain region 241c in each silicon layer 241, a lightly doped source region 261b and a lightly doped drain region 261c in each silicon layer 261, and a lightly doped regions 251S and 251D in each silicon layer 251.

Figure 7E:
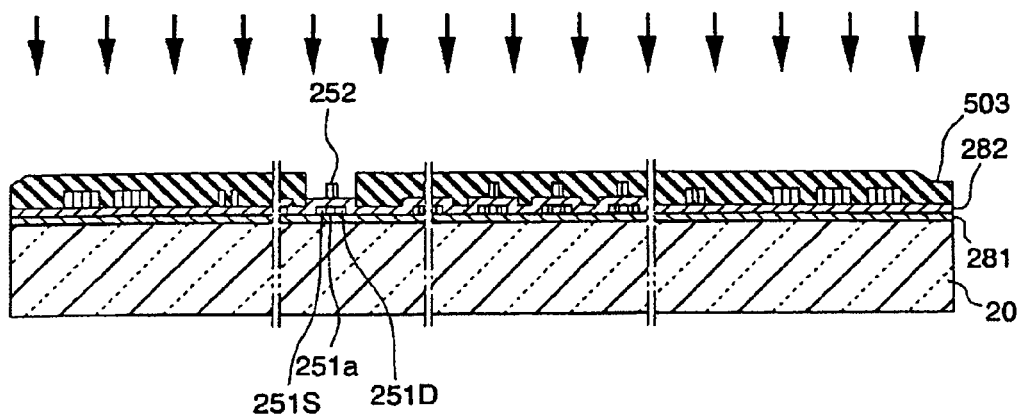
FIGS. 7E-G show sectional views illustrating steps following the steps in FIG. 6.

Referring to FIG. 7(e), an ion-implantation-selection mask 503 is formed on the entire surface of the substrate 20 other than parts for the p-channel drive circuit TFTs including the gate electrodes 252. Using the mask 503, boron ions are implanted into the silicon layers 251 at a dosage of about $1.5 \times 10^{15}$ cm². As a result, the dopant is self-aligned to the gate electrodes 252, which function as masks, to counterdope the lightly doped regions 251S and 251D into source and drain regions of the p-channel drive circuit TFTs.

Figure 7F:
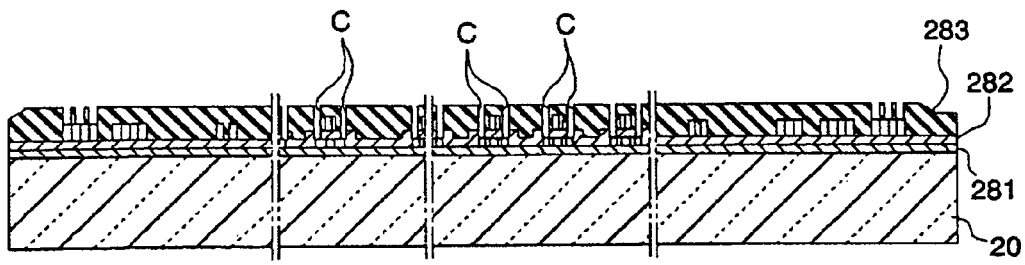

Referring to FIG. 7(f), the first interlayer insulating layer 283 is formed on the entire surface of the substrate 20. This first interlayer insulating layer 283 is then patterned by photolithography to form contact holes C at positions at which the source and drain electrodes of the TFTs are to be formed.

Figure 7G:
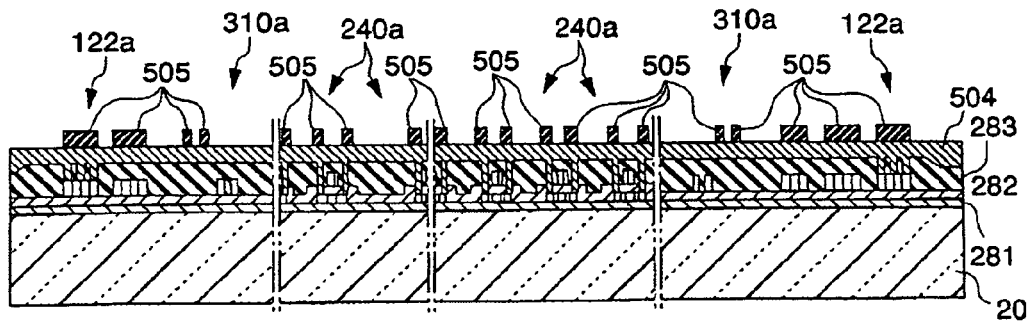
Figure 8H:
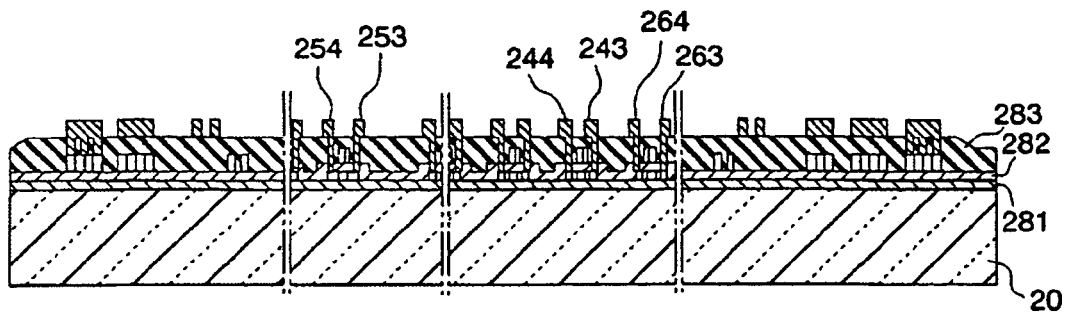
FIGS. 8H-J show sectional views illustrating steps following the steps in FIG. 7.

Referring to FIG. 7(g), the first interlayer insulating layer 283 is covered with a conductive layer 504 that is composed of a metal such as aluminum, chromium, and tantalum and has a thickness of about 200 to 800 nm. Subsequently, patterning masks 505 are formed on regions 240a of the conductive layer 504 on which the source and drain electrodes of the TFTs are to be formed, regions 310a on which the drive voltage conducting parts 310 (340) are to be formed, and regions 122a on which second cathode power wiring layers are to be formed. Referring to FIG. 8(h), the conductive layer 504 is patterned to form source electrodes 243, 253, and 263 and drain electrodes 244, 254, and 264.

Figure 8I:
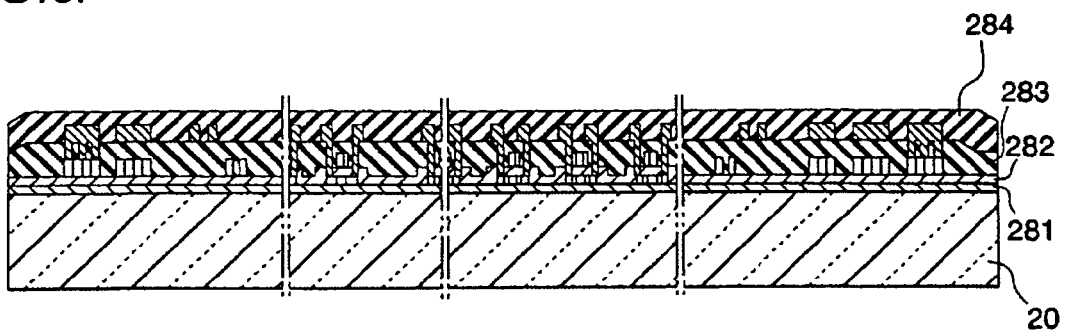

Referring to FIG. 8(i), the first interlayer insulating layer 283, on which the above components are formed, is covered with the second interlayer insulating layer 284, which is composed of, for example, a polymeric material such as an acrylic resin and preferably has a thickness of about 1 to 2 μm. The second interlayer insulating layer 284 may also be composed of SiN or $SiO_2$. If the second interlayer insulating layer 284 is composed of SiN, it preferably has a thickness of 200 nm. If, on the other hand, the second interlayer insulating layer 284 is composed of $SiO_2$, it preferably has a thickness of 800 nm.

Figure 8J:
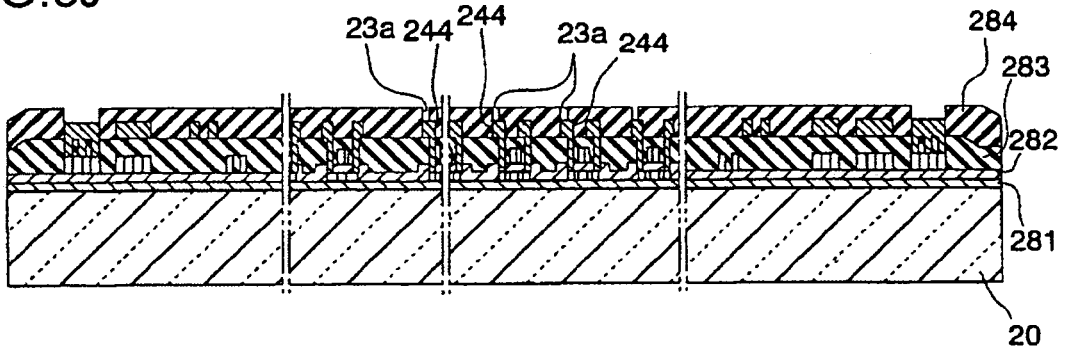

Referring to FIG. 8(j), the second interlayer insulating layer 284 is etched to remove the parts corresponding to the drain electrodes 244 of the drive TFTs 123, thus forming the contact holes 23a.

Figure 9K:
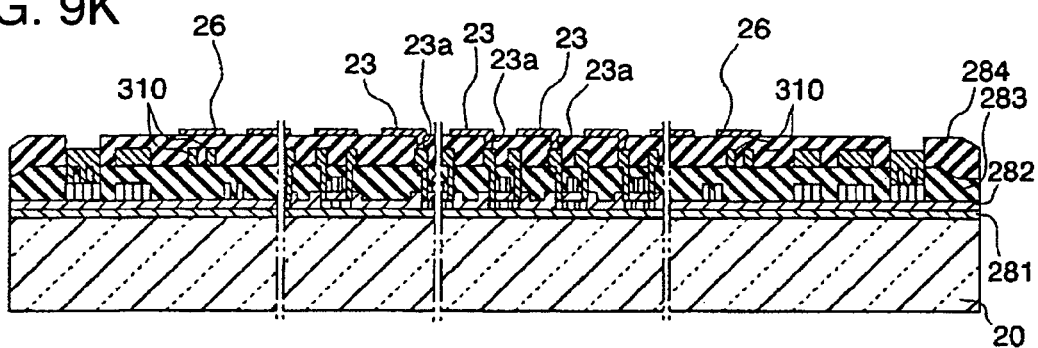
FIGS. 9K-M show sectional views illustrating steps following the steps in FIG. 8.

Referring to FIG. 9(k), a transparent conductive film for forming the pixel electrodes 23 is formed on the entire surface of the substrate 20 and is patterned to provide the pixel electrodes 23 in the effective display region 4 and dummy electrodes 26 in the dummy region 5. The pixel electrodes 23 are connected to the drain electrodes 244 via the contact holes 23a in the second interlayer insulating layer 284. In FIGS. 3 and 4, the pixel electrodes 23 and the dummy electrodes 26 are collectively referred to as the pixel electrodes 23.

The dummy electrodes 26 are not connected to the lower metal wiring through the second interlayer insulating layer 284. These dummy electrodes 26, which are isolated from each other and have substantially the same shape as the pixel electrodes 23 in this embodiment, may have a different configuration from the pixel electrodes 23. In this case, the dummy electrodes 26 at least include those disposed above the drive voltage conducting parts 310 (340).

Figure 9L:
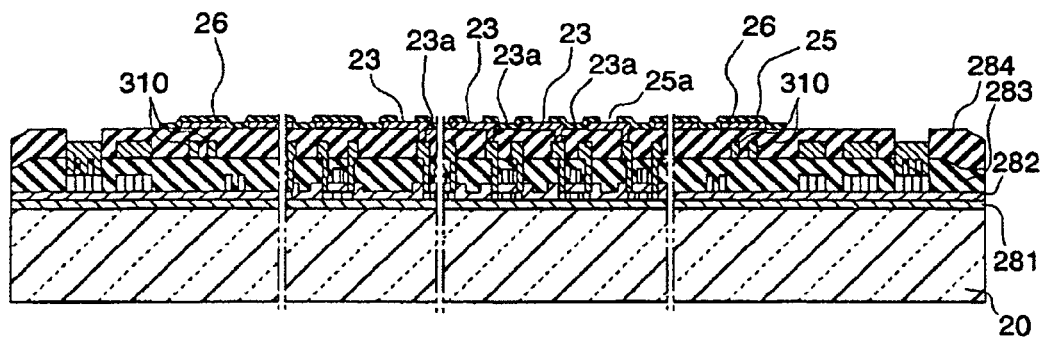

Referring to FIG. 9(l), the lyophilic control layer 25, which is an insulating layer, is formed on the pixel electrodes 23, the dummy electrodes 26, and the second interlayer insulating layer 284. This lyophilic control layer 25 has an opening 25a (see also FIG. 3) on each pixel electrode 23 to allow the transfer of holes from the pixel electrode 23. On the other hand, the lyophilic control layer 25 has no opening on each dummy electrode 26, thus blocking the transfer of holes at the dummy electrode 26.

The lyophilic control layer 25 also has depressions formed between every two adjacent pixel electrodes 23. A BM is formed on the depressions of the lyophilic control layer 25. Specifically, metal chromium is deposited on the depressions by sputtering.

Figure 9M:
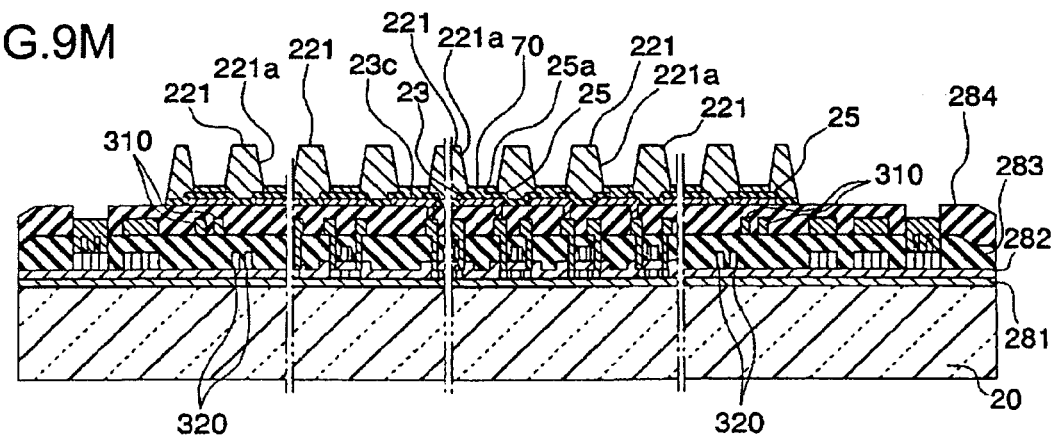

Referring to FIG. 9(m), the organic bank layers 221 are formed on predetermined positions of the lyophilic control layer 25, namely, on the BM. Specifically, for example, an organic layer for forming the organic bank layers 221 is formed by coating, such as spin coating and dip coating, with a solution of a resist such as acrylic and polyimide resins. This organic layer may be composed of any material that is insoluble to an ink solvent described later and that is readily patterned by, for example, etching.

The organic layer is then etched by, for example, photolithography to form the bank openings 221a, thus providing the organic bank layers 221. The organic bank layers 221 have wall surfaces in the bank openings 221a. In this case, the organic bank layers 221 at least include those disposed above the drive control signal conducting parts 320.

Subsequently, lyophilic regions and liquid-repellent regions are provided on the surfaces of the organic bank layers 221. In this embodiment, these regions are provided through a plasma processing step. Specifically, this plasma processing step includes the substeps of preheating the substrate 20; subjecting the top and wall surfaces of the organic bank layers 221, electrode surfaces 23c of the pixel electrodes 23, and the top surface of the lyophilic control layer 25 to lyophilic treatment; subjecting the top and wall surfaces of the organic bank layers 221 to liquid-repellent treatment; and cooling the substrate 20.

That is, the overall substrate 20 is heated to a predetermined temperature, for example about 70° C. to 80° C., is subjected to plasma processing using oxygen as a reactive gas ($O_2$ plasma processing) in air at the substep of the lyophilic treatment, is subjected to plasma processing using tetrafluoromethane as a reactive gas ($CF_4$ plasma processing) in air at the substep of the liquid-repellent treatment, and is cooled to room temperature. This plasma processing step provides the lyophilic and liquid-repellent regions at predetermined positions.

The $CF_4$ plasma processing, though slightly affecting the electrode surfaces 23c of the pixel electrodes 23 and the lyophilic control layer 25, maintains their lyophilicity. Hydroxyl groups provided at the substep of the lyophilic treatment are not replaced by fluorine radicals because ITO, which is an example of the material for the pixel electrodes 23, and $SiO_2$ and $TiO_2$, which are examples of the material for the lyophilic control layer 25, lack an affinity for fluorine.

Figure 10N:
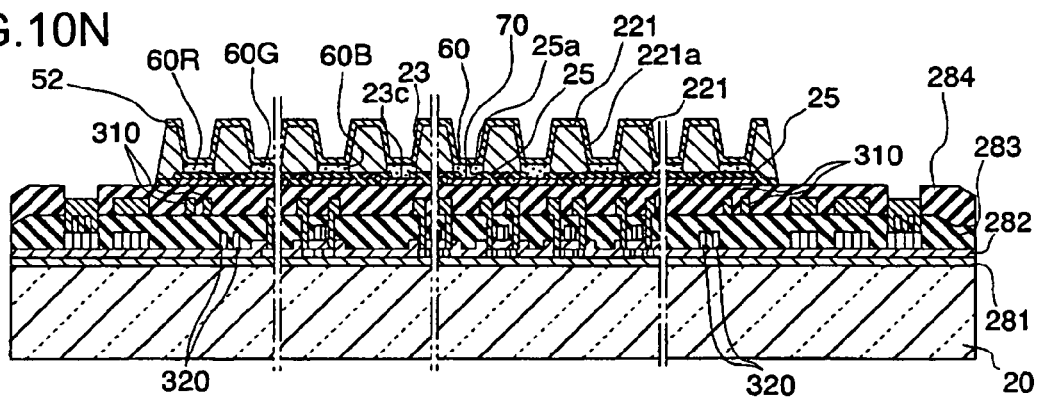
FIGS. 10N-O show sectional views illustrating steps following the steps in FIG. 9.

Referring to FIG. 10(n), a step of forming the hole-injection/transport layers 70 is performed. This step is preferably performed by droplet discharging, particularly inkjetting. The hole-injection/transport layers 70 are formed on the pixel electrodes 23 by selectively applying, drying, and heat-treating the material for the hole-injection/transport layers 70 on the electrode surface 23c of the pixel electrodes 23. An example of the material for the hole-injection/transport layers 70 is a solution of PEDOT/PSS, which has been described above, and a polar solvent such as isopropyl alcohol.

First, the material for the hole-injection/transport layers 70 is charged into an inkjet heat (not shown in the drawings). A discharging nozzle of the inkjet head is opposed to the electrodes surfaces 23c in the openings 25a provided in the lyophilic control layer 25. A predetermined amount of droplet is applied from the discharging nozzle onto each electrode surface 23c while the inkjet head and the overall substrate 20 are relatively shifted. The applied droplets are dried to evaporate the dispersion medium or solvent contained, thus forming the hole-injection/transport layers 70.

The droplets applied from the discharging nozzle cover the electrode surfaces 23c and accumulate in the openings 25a of the lyophilic control layer 25 because the electrode surfaces 23c have been subjected to lyophilic treatment. On the other hand, the droplets are repelled by the top surfaces of the organic bank layers 221 because the top surfaces of the organic bank layers 221 have been subjected to liquid-repellent treatment. The droplets thus fail to adhere to the top surfaces of the organic bank layers 221. Hence, even if the droplets deviate from predetermined discharging positions and part of the droplets is applied on the surfaces of the organic bank layers 221, the droplets do not wet the surfaces of the organic bank layers 221 and are repelled and drawn into the openings 25a of the lyophilic control layer 25.

The steps following the step of forming the hole-injection/transport layers 70 are preferably performed in an atmosphere of an inert gas such as nitrogen and argon to inhibit the oxidation and moisture adsorption of the constituent materials used and the components formed.

A step of forming the luminescent layers 60 is then performed. This step is preferably performed by inkjetting, which is a droplet discharging method, as in the step of forming the hole-injection/transport layers 70. A material for forming the luminescent layers 60 is applied, dried, and heat-treated on the hole-injection/transport layers 70 to form the luminescent layers 60 in the bank openings 221a defined by the organic bank layers 221, namely, in pixel areas. In the step of forming the luminescent layers 60, a nonpolar solvent that is insoluble to the hole-injection/transport layers 70 is used as the ink solvent for forming the luminescent layers 60 to inhibit the redissolution of the hole-injection/transport layers 70. The formation of the luminescent layers 60 is performed for each color.

A step of forming the electron-injection layer 52 on the luminescent layers 60 is then performed. An organic metal complex having a central atom of the same element as a constituent element (for example, Ca) of the cathode 50 is used for the electron-injection layer 52. This electron-injection layer 52 may be formed by a known method such as resistance heating deposition and coating. For example, the above complex (for example, $Ca(acac)_2$) is dissolved in a solvent, is applied on the entire surface of the substrate 20 by spin coating, and is dried to form the electron-injection layer 52.

In the step of forming the electron-injection layer 52, the above complex may be formed by deposition. In this case, for example, an organic material (for example, acac) for forming a ligand of the complex is deposited on the entire surface of the substrate 20 so as to cover exposed parts of the luminescent layers 60, and a constituent metal (for example, Ca) of the cathode 50 is deposited on the organic material. The deposited metal atoms combine with the previously deposited ligand molecules to form the electron-injection layer 52. This deposition is continued to form part of the cathode 50 (in the vicinity of the interface to the electron-injection layer 52). Subsequently, for example, Al or ITO is further deposited on the part of the cathode 50 to form the cathode 50, which is composed of a laminate of the Ca film and the Al or ITO film. According to this method, the single deposition step enables successive formation of the electron-injection layer 52 and part of the cathode 50, thus facilitating the process.

If an organic metal complex having a central atom and chelating and neutral ligands surrounding the central atom is used for the electron-injection layer 52, the electron-injection layer 52 may be formed by a known method such as resistance heating deposition and coating. Examples (a) to (e) of the method used will now be described.

(a) Method for Co-Depositing Neutral Ligand and Complex

In this method, a metal element having a low work function is selected for the central atom and is co-deposited with organic materials for the chelating and neutral ligands on the entire surface of the substrate 20. Alternatively, an organic metal complex (first organic metal complex) having the same number of chelating ligands as the valence of the above central atom is co-deposited with the organic material for the neutral ligand to form an organic metal complex (second organic metal complex) having a larger number of ligands than the valence of the central atom.

The co-deposition enables cathode design suited to the luminescent material used because known complex and ligand materials can be freely combined in a deposition machine. In addition, an organic metal complex having any composition can be provided by changing deposition conditions (for example, the deposition temperature of the complex and the ligands), so that the element structure can be readily optimized. The complex preferably has a central atom of the same element as a constituent element of the cathode 50, which is formed in a subsequent step. Such a complex can adhere more strongly to the cathode 50. Furthermore, this element, even if diffusing downward during the formation of the cathode 50, does not act as an impurity on the electron-injection layer 52, thus contributing to the electrical stability of the elements.

(b) Method for Co-Depositing Neutral Ligand and Different Types of Complexes

In this method, optimum organic metal complexes (first organic metal complexes) selected for the individual types of the R, G, and B luminescent layers 60 are co-deposited with the organic material for the neutral ligand on the entire surface of the substrate 20 to form organic metal complexes (second organic metal complexes) having a larger number of ligands than the valence of the central atom.

When each pixel includes R, G, and B luminescent layers as in this embodiment, the different types of luminescent layers may have different optimum complexes. If only a single complex is formed on the luminescent layers as in method (a), the complex cannot necessarily have a desirable effect on all types of luminescent layers. According to this method, on the other hand, the electron-injection layer 52 formed contains a mixture of different complexes corresponding to the individual types of the luminescent layers 60, thus having an excellent electron-injection effect on all types of the luminescent layers 60. According to this method, additionally, the color balance can be adjusted by changing the deposition conditions (for example, deposition temperature) of the complexes.

(c) Method for Coating Entire Surface of Substrate with Complexes

In this method, optimum organic metal complexes (first organic metal complexes) selected for the individual types of the R, G, and B luminescent layers 60 are dissolved in a solvent to prepare a common coating solution. This coating solution is applied on the entire surface of the substrate 20 by, for example, spin coating. This coating is dried to form complexes having the same number of chelating ligands as the valence of the central atom on the luminescent layers 60 (a substep of forming the first organic metal complexes). A polar solvent that is insoluble to the luminescent layers 60 is used as the solvent for the coating solution to inhibit the redissolution of the luminescent layers 60. The organic material for the neutral ligand is then deposited on the complexes to coordinate the neutral ligand to the central atom (a substep of forming the second organic metal complexes).

This method is the same as method (b) except that a wet process (namely, coating) is employed; therefore, this method provides the same structure as method (b). In this method, a coating solution of organic metal complexes to which the neutral ligand has been coordinated may be applied. As the number of the ligands coordinated is increased, the polarities of the complexes are lowered and accordingly a solvent having a lower polarity is required for preparing the coating solution. A coating solution prepared using such a solvent having a lower polarity may redissolve the luminescent layers 60. To avoid such an accident, preferably, complexes having no neutral ligand (namely, complexes having less ligands) are used in the coating step, and the step of coordinating the neutral ligand is performed separately from the coating step.

(d) Method for Separately Forming Electron-Injection Layer on Each Luminescent Layer In this method, optimum organic metal complexes (first organic metal complexes) selected for the individual types of the R, G, and B luminescent layers 60 are used to prepare coating solutions for the individual types of the luminescent layers 60. Each coating solution is selectively applied onto the corresponding type of the luminescent layers 60 by droplet discharging (for example, inkjetting). These coatings are dried to form separate electron-injection layers on the individual luminescent layers 60 (the substep of forming the first organic metal complexes). The organic material for the neutral ligand is then deposited on the complex to coordinate the neutral ligand to the central atom (the substep of forming the second organic metal complexes).

According to methods (a) to (c), the electron-injection layer 52 is homogeneously formed on substantially the entire surface of the substrate 20 in contrast to the steps of forming the hole-injection/transport layers 70 and the luminescent layers 60, where the materials used are selectively applied only onto the pixel areas. This electron-injection layer 52, though simplifying the manufacture, cannot necessarily have a desirable electron-injection effect on all types of the luminescent layers 60. In this method, on the other hand, optimum coating solutions adjusted for the individual types of the luminescent layers 60 are selectively applied onto the corresponding types of the luminescent layers 60 by droplet discharging to form the complexes. This method therefore enables separate material design for the individual types of the luminescent layers 60, thus maximizing the luminescent efficiency of each type of the luminescent layers 60 and facilitating the adjustment of color balance.

(e) Method for Applying Complexes Together with Organic Material for Neutral Ligand In this method, optimum organic metal complexes (first organic metal complexes) selected for the individual types of the R, G, and B luminescent layers 60 are mixed with the organic material for the neutral ligand in a solvent to prepare coating solutions for the individual types of the luminescent layers 60. These coating solutions are selectively applied onto the corresponding types of the luminescent layers 60 by droplet discharging. These coatings are dried to form separate electron-injection layers on the individual luminescent layers 60.

This method is the same as method (d) except that the neutral ligand is formed by a wet process; therefore, this method provides the same structure as method (d). According to this method, the electron-injection layers are formed by a wet process, so that the overall process for manufacturing the luminescent elements, including the above steps of forming the hole-injection/transport layers 70 and the luminescent layers 60, can be performed by a wet process.

Figure 10O:
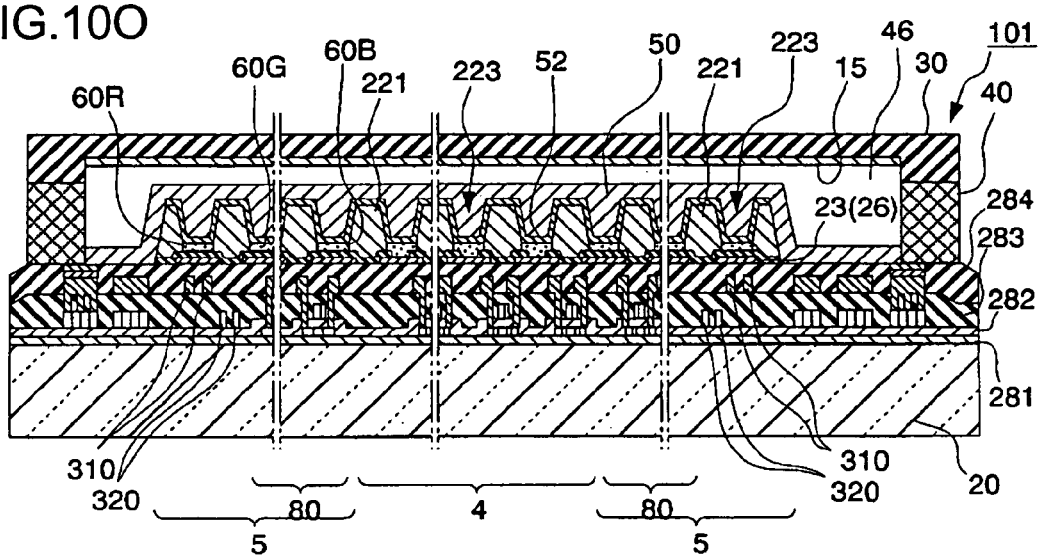

Referring to FIG. 10(o), a step of forming the cathode 50 is performed by deposition. In this step, a film of a metal (for example, Ca) having a low work function is formed on the entire exposed part of the electron-injection layer 52 by deposition or sputtering, and a film of another metal (for example, Al or ITO) having a higher work function than the above metal is formed on the metal film. As a result, the cathode 50 is formed, which is composed of a laminate of the Ca and Al (or ITO) films. Alternatively, in this step, Al (or ITO) may be directly deposited on the electron-injection layer 52 to form the cathode 50, which is composed of an Al (or ITO) monolayer film. In this case, an organic metal complex having a central atom of Al, which is a constituent material of the cathode 50, may be used for the electron-injection layer 52 to enhance the adhesion between the cathode 50 and the electron-injection layer 52.

Finally, a sealing step of forming the sealing substrate 30 is performed. In this sealing step, the substrate 20 and the sealing substrate 30 are sealed with the sealing resin 40 while a desiccant 45 is inserted between them. This sealing step is preferably performed in an atmosphere of an inert gas such as nitrogen, argon, and helium.

According to this embodiment, as described above, an organic metal complex is used for the electron-injection layer 52 to enhance the adhesion of the electron-injection layer 52 to the cathode 50, which is composed of a metal, and to the luminescent layers 60, which are composed of an organic material. This embodiment can therefore improve the luminescent efficiency of each type of the R, G, and B luminescent layers 60.

In particular, this embodiment, in which a larger number of ligands than the valence of the central atom of the organic metal complex are coordinated to the central atom, can inhibit the deterioration of the electron-injection layer 52 during, for example, the formation of the cathode 50 more reliably than known methods.

The known organic metal complex described above has a central atom to which chelating ligands are coordinated. The number of the ligands corresponds to the valence of the central atom. If the central atom is of an element having a smaller valence number (for example, an alkali metal), fewer ligands surround the central atom (for example, the above known complex has one ligand). Consequently, as described above, the central atom may be separated from the ligands, depending on the deposition conditions of the cathode 50. In general, the coordination number of the central atom is larger than the valence of the central atom. If ligands other than the chelating ligands (for example, neutral ligands such as heterocyclic amines) are coordinated to the central atom as in this embodiment, the central atom can have a larger number of ligands than the valence of the central atom. The coordination bond of ligands other than the chelating ligands to the central atom can increase the chemical stability of the complex. In addition, these ligands surround the central atom to act as steric hindrance, thereby stably holding the central atom. This embodiment can therefore increase the stability of the complex to inhibit the intrusion of impurities into the luminescent layers 60, thus providing an organic EL device having high luminescent efficiency and stable characteristics. Furthermore, higher complex stability leads to higher moisture resistance.

EXAMPLES

Examples of the present invention will now be described.
In an example of the present invention, R, G, and B luminescent elements were prepared using the above materials.

The specific process of this example is described below. First, ITO was deposited on a glass substrate to form anodes. PEDOT was then applied onto the anodes and was dried to form hole-injection/transport layers. Luminescent materials having a n-conjugated fluorene skeleton, as described above, were applied onto the hole-injection/transport layers and were dried to form organic luminescent layers. These luminescent layers were coated with Ca(acac)$_2$, which is a β-diketone complex. This coating was dried to form an electron-injection layer having a thickness of 0.5 nm on the luminescent layers. Finally, a Ca film having a thickness of 20 nm and an Al film having a thickness of 200 nm were deposited to form a cathode, thus providing a bottom-emission EL device.

On the other hand, as a comparative example, an EL device was produced which has the same structure as that in the above example, except that the electron-injection layer was composed of LiF.

Tables 1 and 2 show the initial characteristics of the devices (luminous intensity (cd/m$^2$) during the application of a voltage of 6 V; and luminescent efficiency (cd/A)). In Table 1, the luminous intensity and luminescent efficiency of the device in the example of the present invention are normalized with reference to the data of the device in the comparative example.

TABLE 1

| Luminous intensity (cd/m$^2$) at 6 V (normalized) | Comparative example LiF/Ca/Al | Example Ca(acac)$_2$/Ca/Al |
|---|---|---|
| Red | 1 | 2.23 |
| Green | 1 | 2.56 |
| Blue | 1 | 1.25 |

TABLE 2

| Efficiency (cd/A) (normalized) | Comparative example LiF/Ca/Al | Example Ca(acac)$_2$/Ca/Al |
|---|---|---|
| Red | 1 | 1.16 |
| Green | 1 | 1.24 |
| Blue | 1 | 1.29 |

Tables 1 and 2 indicate that the R, G, and B luminescent elements in the example of the present invention have higher luminous intensity and luminescent efficiency than those in the comparative example.

In the example of the present invention, another EL device including a different cathode was produced. This cathode was composed of an Al monolayer film having a thickness of 200 nm, and accordingly the electron-injection layer of this device was composed of an Al(acac)$_2$ film having a thickness of 0.5 nm. A still another EL device was produced which was a top-emission device including a cathode composed of a laminate of a Ca film having a thickness of 5 nm and an ITO film having a thickness of 50 nm and an electron-injection layer composed of a Ca(acac)$_2$ film having a thickness of 0.5 nm. The R, G, and B luminescent elements of these devices were found to have higher luminous intensity and luminescent efficiency than those in the comparative example.

Electronic Appliance

Electronic appliances including an organic EL device according to the present invention will now be described. An example of electronic appliances of the present invention includes the organic EL device described above as a display, and is shown in FIG. 11.

Figure 11:
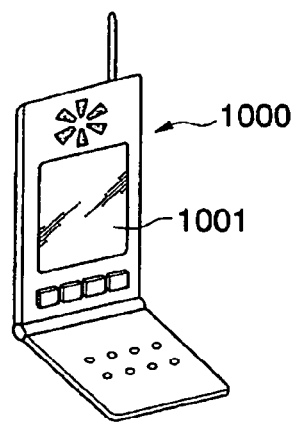
FIG. 11 is a perspective view of an example of electronic appliances according to the present invention.

FIG. 11 is a perspective view of an example of cellular phones. In FIG. 11, a cellular phone 1000 has a display composed of an organic EL device 1001 according to the present invention. This cellular phone 1000, including the organic EL device 1001, provides a long life and a bright display.

The present invention is not limited to the above embodiments, and various modifications are permitted within the scope of the present invention.

For example, the luminescent layers 60, which are composed of a polymeric material in the above embodiment, may be composed of a low-molecular-weight material. In addition, the above circuit part 11, which is an example, may have a different structure. Furthermore, the organic EL device of the present invention, which is applied to a display in the above embodiment, may be used as a backlight (lighting device) for, for example, transmissive liquid crystal displays by forming the luminescent layers 60 on the entire surface of the substrate 20.

What is claimed is:

1. An organic electroluminescent device comprising:
    an anode;
    a cathode;
    an organic luminescent layer disposed between the anode and the cathode;
    an electron-injection layer disposed between the cathode and the organic luminescent layer;
    the electron-injection layer including an organic metal complex comprising a central atom and a number of chelating ligands equal to a valence of the central atom;
    wherein the central atom is the same metal element as a constituent element of the cathode in the vicinity of an interface to the electron-injection layer and the cathode; and
    wherein the organic metal complex is calcium diacetylacetone 2,2'-bipyridine and the constituent element of the cathode is calcium.

2. A method for manufacturing an organic electroluminescent device, comprising:
    forming an organic luminescent layer;
    forming an electron-injection layer; and
    forming a cathode,
    wherein the forming of the electron-injection layer comprises forming an organic metal complex by discharging droplets including an organic metal complex having a number of chelating ligands as a valence of a central atom of the organic metal complex, the central atom being the same metal element as a constituent element of the cathode in the vicinity of an interface to the electron-injection layer and the cathodes and
    wherein the organic metal complex is calcium diacetylacetone 2,2'-bipyridine and the constituent element of the cathode is calcium.

3. An organic electroluminescent device comprising:
    an anode;
    a cathode;
    an organic luminescent layer disposed between the anode and the cathode;

an electron-injection layer disposed between the cathode and the organic luminescent layer, the electron-injection layer including an organic metal complex,
wherein the organic metal complex is calcium diactetylacetone 2,2'-bipyridine and the constituent element of the cathode is calcium.

4. A method for manufacturing an organic electroluminescent device, comprising:

forming an organic luminescent layer;

forming an electron-injection layer including calcium diactetylacetone 2,2'-bipyridine; and forming a cathode including calcium.

* * * * *